(12) United States Patent
Han et al.

(10) Patent No.: US 7,928,651 B2
(45) Date of Patent: Apr. 19, 2011

(54) TOP EMISSION TYPE ORGANIC ELECTRO LUMINESCENCE DEVICE AND FABRICATION METHOD THEREOF

(75) Inventors: Chang Wook Han, Seoul (KR); Jae Yong Park, Anyang-si (KR); Hee Suk Pang, Pyeongtaek-si (KR)

(73) Assignee: LG Display Co., Ltd., Seoul (KR)

( * ) Notice: Subject to any disclaimer, the term of this patent is extended or adjusted under 35 U.S.C. 154(b) by 409 days.

(21) Appl. No.: 11/169,751

(22) Filed: Jun. 30, 2005

(65) Prior Publication Data
US 2006/0001362 A1 Jan. 5, 2006

(30) Foreign Application Priority Data
Jun. 30, 2004 (KR) .................. 10-2004-0049980

(51) Int. Cl.
H05B 33/00 (2006.01)

(52) U.S. Cl. ........................................ 313/506; 313/504

(58) Field of Classification Search .................. 313/504, 313/506, 512
See application file for complete search history.

(56) References Cited

U.S. PATENT DOCUMENTS

| | | | | |
|---|---|---|---|---|
| 5,986,401 | A * | 11/1999 | Thompson et al. | 313/504 |
| 6,559,594 | B2 * | 5/2003 | Fukunaga et al. | 313/506 |
| 2002/0180350 | A1 * | 12/2002 | Furugori et al. | 313/506 |
| 2003/0067266 | A1 * | 4/2003 | Kim et al. | 313/504 |
| 2003/0107326 | A1 * | 6/2003 | Park et al. | 315/169.3 |
| 2003/0137325 | A1 * | 7/2003 | Yamazaki et al. | 327/80 |
| 2004/0178724 | A1 * | 9/2004 | Karasawa et al. | 313/506 |

* cited by examiner

Primary Examiner — Nimeshkumar D Patel
Assistant Examiner — Anthony T Perry
(74) Attorney, Agent, or Firm — Birch, Stewart, Kolasch & Birch, LLP

(57) ABSTRACT

An organic electro luminescence device is provided. First and second substrates are arranged to face each other. A thin film transistor (TFT) is formed on the first substrate in each sub-pixel. A first electrode is formed on the first substrate and connected to the TFT. An organic electro luminescent layer and a second electrode are formed on the first electrode. A black matrix is disposed below the first electrode.

14 Claims, 4 Drawing Sheets

TOP EMISSION TYPE ORGANIC ELECTRO LUMINESCENCE DEVICE AND FABRICATION METHOD THEREOF

This application claims the benefit of Korean Patent Application No. 10-2004-0049980 filed in Korea on Jun. 30, 2004, which is hereby incorporated by reference for all purposes as if fully set forth therein.

BACKGROUND OF THE INVENTION

1. Field of the Invention

The present invention relates to an organic electro luminescence device, and more particularly, to a top emission type organic electro luminescence device and a fabrication method thereof.

2. Description of the Related Art

In the fields of flat panel display devices, a liquid crystal display device (LCD) is widely used because it is lightweight and has low power consumption. However, the LCD is a non-luminous display device and has technical limitations in brightness, contrast, viewing angle, and large size. Therefore, new flat panel display devices capable of overcoming these drawbacks have been developed actively.

One of the new flat panel display devices is an organic electro luminescence device. Since the organic electro luminescence device is a self-luminous display device, it has a high contrast and wide viewing angle compared with the LCD. Also, since the organic electro luminescence device does not require a backlight assembly, it is lightweight and slim. In addition, the organic electro luminescence device can decrease power consumption.

Further, the organic electro luminescence device can be driven at a low DC voltage and has a fast response speed. Since all of the components of the organic electro luminescence device are formed of solid materials, it is endurable against external impact. It can also be used in a wide temperature range and can be manufactured at a low cost.

Specifically, the organic electro luminescence device is easily fabricated through a deposition process and an encapsulation process. Therefore, the fabrication method and apparatus of the organic electro luminescence device are simpler than those of an LCD or PDP.

If the organic electro luminescence device is driven in an active matrix type, uniform brightness can be obtained even when a low current is applied. Accordingly, the organic electro luminescence device has advantages of low power consumption, high definition and large-sized screen.

FIG. 1 is a schematic sectional view of a related art bottom emission type organic electro luminescence device.

As shown in FIG. 1, first and second substrates 10 and 30 are arranged to face each other. Edge portions of the first and second substrates 10 and 30 are encapsulated by a seal pattern 40. A TFT T is formed on a transparent substrate 1 of the first substrate 10 in each sub-pixel unit. A first electrode 12 is connected to the TFT T. An organic electro luminescent layer 14 is formed on the TFTs and the first electrode 12 and is arranged corresponding to the first electrode 12. The organic electro luminescent layer 14 contains light emission materials taking on red, green and blue colors. A second electrode 16 is formed on the organic electro luminescent layer 14.

The first and second electrodes 12 and 16 function to apply an electric field to the organic electro luminescent layer 14.

Due to the seal pattern 40, the second electrode 16 and the second substrate 30 are spaced apart from each other by a predetermined distance. Therefore, an absorbent (not shown) and a translucent tape (not shown) may be further provided in an inner surface of the second substrate 30. The absorbent absorbs moisture introduced from an exterior, and the translucent tape adheres the absorbent to the second substrate 30.

In the bottom emission type structure, the first electrode 12 and the second electrode 16 are an anode and a cathode, respectively.

The first electrode 12 is formed of a transparent conductive material and the second electrode 16 is formed of a metal having a low work function. In such a condition, the organic electro luminescent layer 14 includes a hole injection layer 14a, a hole transporting layer 14b, an emission layer 14c, and an electron transporting layer 14d, which are sequentially formed on the first electrode 12.

Preferably, the first electrode 12 is formed of indium tin oxide (ITO) and the second electrode 16 is formed of Al, Mg or Ca, which is a metal having a low work function.

The emission layer 14c has red, green and blue color filters in sub-pixels.

However, the related art bottom emission type organic electro luminescence device has a limitation in aperture ratio and thus has difficulty in the application to high-resolution products.

FIG. 2 is a schematic sectional view of a related art top emission type organic electro luminescence device.

Referring to FIG. 2, the emission direction of light emitted from an organic electro luminescent layer 24 is opposite to that of the bottom emission type organic electro luminescence device shown in FIG. 1. For this purpose, the construction of the first and second electrodes 22 and 26 is changed.

Also, in the top emission type organic electro luminescence device, a polarization film 29 is attached on the second substrate 30 so as to solve the reduction of contrast ratio (CR), which is caused by the reflection of an external light.

For example, when the first and second electrodes 22 and 26 are respectively the anode and the cathode, the first electrode 22 must reflect light generated from an organic electro luminescent layer 24 and the second electrode 26 must transmit the light generated from the organic electro luminescent layer 24.

Accordingly, when the first electrode 22 is formed of ITO, a reflection plate 28 must be further provided below the first electrode 22 and the second electrode 26 must be formed thinly so that light can be transmitted.

In another example, when the first and second electrodes are respectively the cathode and the anode, that is, when the polarity of the electrodes in the bottom emission type are reversed, the top emission type can be provided by changing the construction of the organic electro luminescent layer formed between the first electrode and the second electrode.

Like this, in the top emission type organic electro luminescence device, the light generated from the organic electro luminescent layer 24 and passing through the second electrode 26, and the light reflected from the first electrode 22 and passing through the second electrode 26 are emitted toward the second substrate 30, thereby achieving the top emission.

In this case, however, the wavelength of the light reflected from the first electrode 22 and passing through the second electrode 26 is lengthened due to reflection, thus causing a color shift problem. The color shift problem becomes serious as the reflectivity of the first electrode 22 increases.

Also, since the polarization film 29 is attached, only the left-polarized or right-polarized light is transmitted so that optical efficiency of the organic electro luminescence device is reduced by 50%.

SUMMARY OF THE INVENTION

Accordingly, the present invention is directed to a top emission type organic electro luminescence device and a fabrication method thereof that substantially obviate one or more problems due to limitations and disadvantages of the related art.

An object of the present invention is to provide a top emission type organic electro luminescence device and a fabrication method thereof, in which the reflection of the light from the first electrode is minimized by forming the black matrix below the first electrode or forming the first electrode of metal with low reflectivity. Accordingly, the color shift problem caused by reflection can be solved. Also, since the polarization film is not used, the manufacturing cost can be reduced.

Additional advantages, objects, and features of the invention will be set forth in part in the description which follows and in part will become apparent to those having ordinary skill in the art upon examination of the following or may be learned from practice of the invention. The objective and other advantages of the invention may be realized and attained by the structure particularly pointed out in the written description and claims hereof as well as the appended drawings.

To achieve these objective and other advantages and in accordance with the purpose of the invention, as embodied and broadly described herein, there is provided an organic electro luminescence device comprising: first and second substrates arranged to face each other; a thin film transistor (TFT) formed on the first substrate in each sub-pixel; a first electrode formed on the first substrate and connected to the TFT; an organic electro luminescent layer and a second electrode formed on the first electrode; and a black matrix disposed below the first electrode.

In another aspect of the present invention, there is provided a top emission type organic electro luminescence device comprising: first and second substrates arranged to face each other; a thin film transistor (TFT) formed on the first substrate in each sub-pixel; an anode with low reflectivity, formed on the first substrate and electrically connected to the TFT; an organic electro luminescent layer and a cathode formed on the anode; and a seal pattern formed at edge portions of the first and a seal pattern formed at edge portions of the first and second substrates.

In a further another aspect of the present invention, there is provided a fabrication method of an organic electro luminescence device, the fabrication method comprising: forming a thin film transistor (TFT) on a first substrate in each sub-pixel; forming a first electrode electrically connected to the TFT, and a black matrix below the first electrode; forming an organic electro luminescent layer and a second electrode on the first electrode; and coupling a second substrate to the first substrate.

In a further aspect of the present invention, there is provided a method of forming a top emission type organic electro luminescence device, the method comprising: arranging first and second substrates to face each other; forming a thin film transistor (TFT) on the first substrate in each sub-pixel; forming an anode with low reflectivity on the first substrate, the anode electrically connected to the TFT; forming an organic electrode luminescent layer and a cathode on the anode; and forming a seal pattern at edge portions of the first and second substrates.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
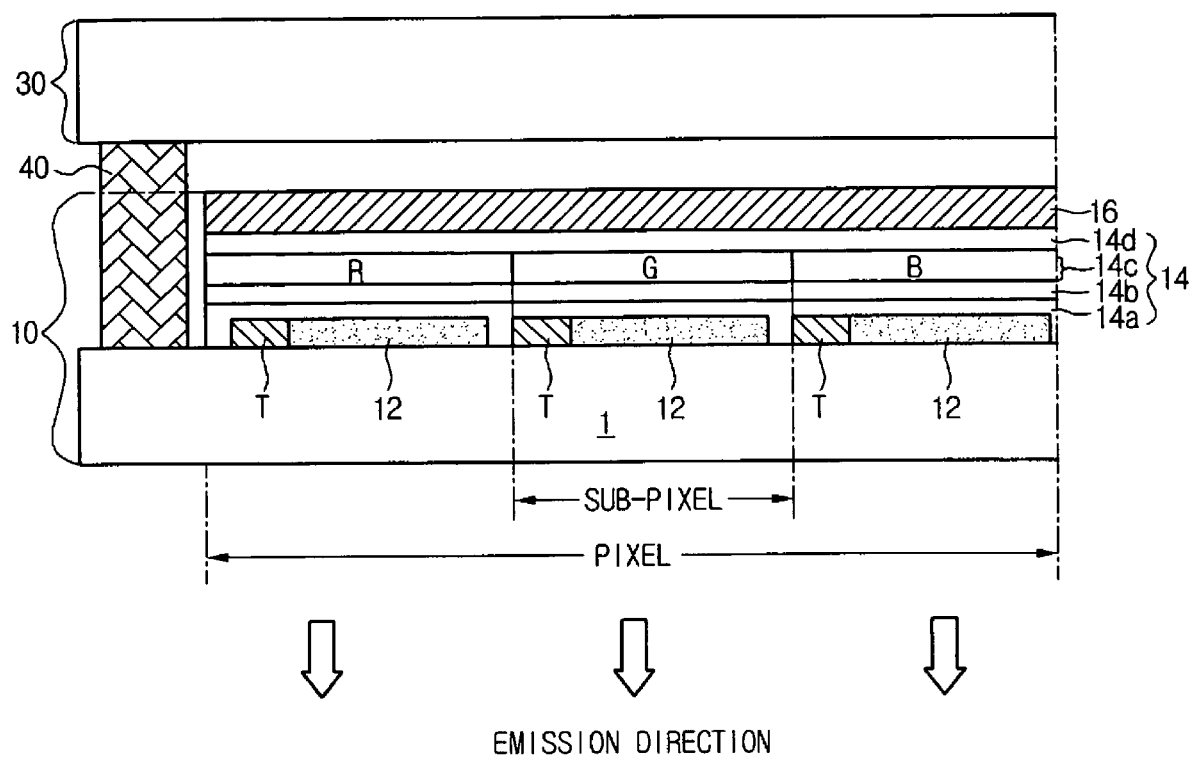
FIG. 1 is a schematic sectional view of a related art bottom emission type organic electro luminescence device.
Figure 2:
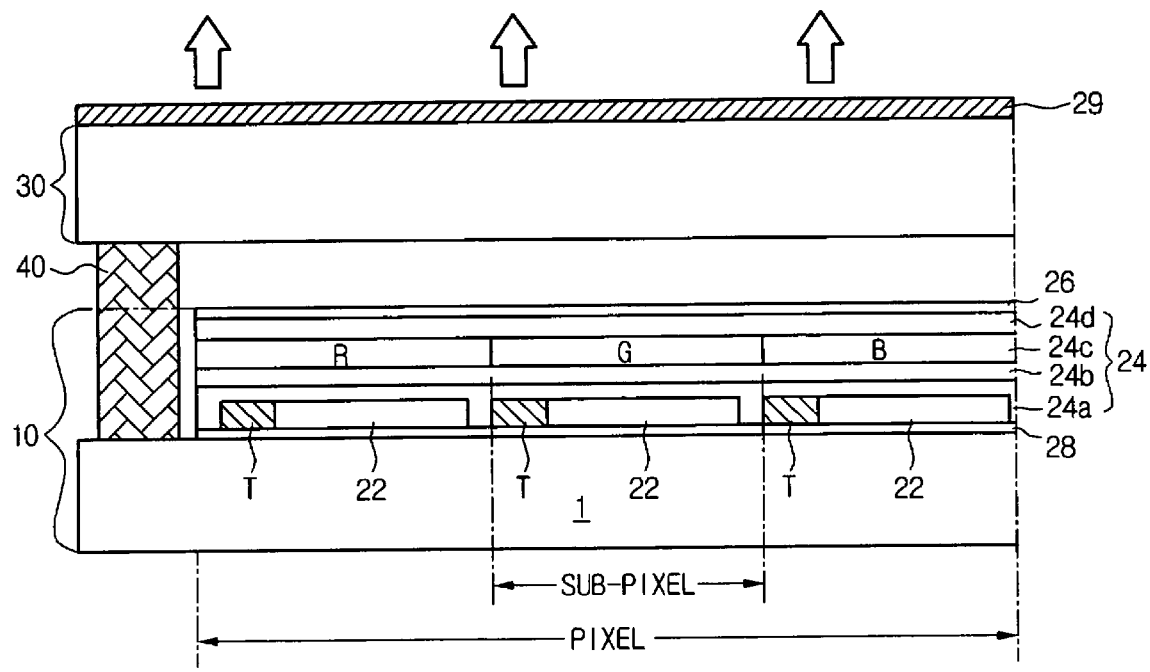
FIG. 2 is a schematic sectional view of a related art top emission type organic electro luminescence device.
Figure 3:
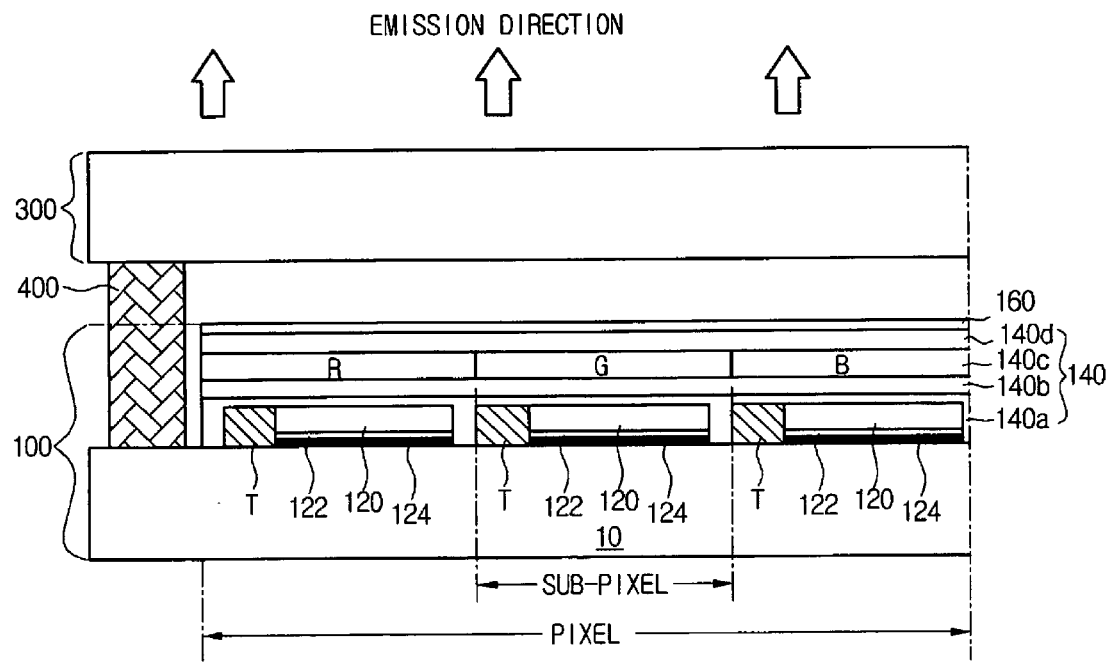
FIG. 3 is a schematic sectional view of a top emission type organic electro luminescence device according to an embodiment of the present invention.
Figure 4:
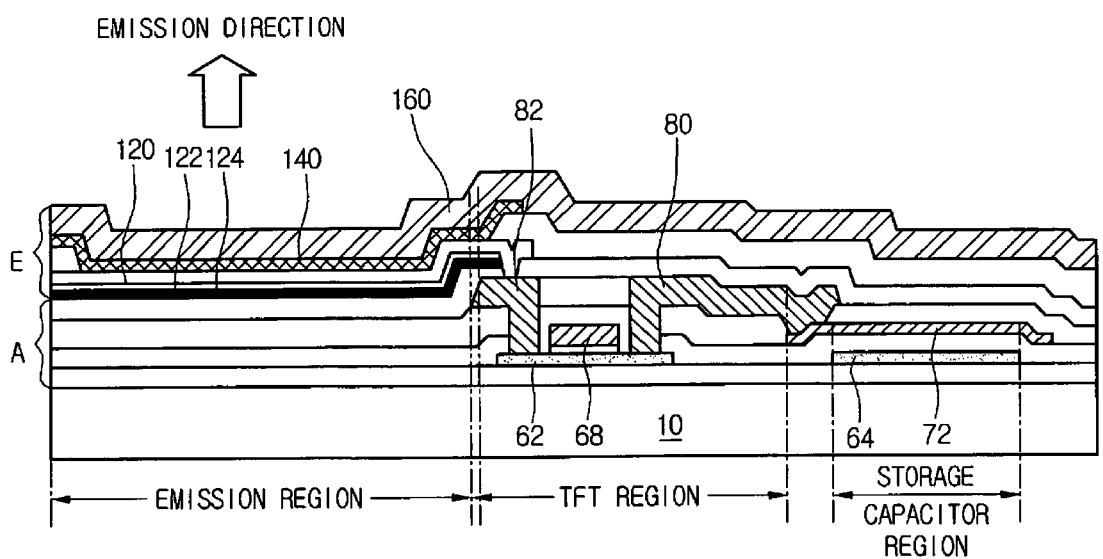
FIG. 4 is an enlarged sectional view illustrating one sub-pixel of the organic electro luminescence device shown in FIG. 3 according to an embodiment of the present invention.

FIG. 3 is a schematic sectional view of a top emission type organic electro luminescence device according to an embodiment of the present invention, and FIG. 4 is an enlarged sectional view illustrating one sub-pixel of the organic electro luminescence device shown in FIG. 3. All the components of the device are operatively coupled.

Referring to FIG. 3, first and second substrates 100 and 300 are arranged to face each other. Edges of the first and second substrates 100 and 300 are encapsulated by a seal pattern 400. A thin film transistor (TFT) T is formed on a transparent substrate 10 of the first substrate 100 in each of sub-pixels.

Also, a first electrode 120 is connected to the TFT. An organic electro luminescent layer 140 is formed on the TFTs and the first electrode 120 and is arranged corresponding to the first electrode 120. The organic electro luminescent layer 140 contains light emission materials taking on red, green and blue colors. A second electrode 160 is formed on the organic electro luminescent layer 140.

The first and second electrodes 120 and 160 function to apply an electric field to the organic electro luminescent layer 140.

Due to the seal pattern 400, the second electrode 160 and the second substrate 300 are spaced apart from each other by a predetermined distance. Therefore, an absorbent absorbing moisture entered from an outside is provided in an inner surface of the second substrate 300.

In the top emission type organic electro luminescence device, it is preferable to use a transparent coating agent as the absorbent.

In the embodiment shown in FIG. 3, the first electrode 120 and the second electrode 160 are an anode and a cathode, respectively.

The organic electro luminescent layer 140 includes a hole injection layer 140a, a hole transporting layer 140b, an emission layer 140c, and an electron transporting layer 140d, which are sequentially formed on the first electrode 120.

The emission layer 140c has red, green and blue color filters in sub-pixels.

Since the second electrode 160 must transmit light, the second electrode 160 is formed thinly of Al, Mg or Ca having a low work function so that light can be transmitted.

Alternatively, it is preferable that the second electrode 160 is formed in a dual layer including Al of about 10 Å and ITO of about 1000 Å.

When a transparent material such as ITO or IZO is used for the first electrode 120, a black matrix 124 is formed below the first electrode 120.

In order to solve the color shift problem that is caused when the wavelength of the light reflected from the first electrode 120 is lengthened, the black matrix 124 is formed below the transparent first electrode 120. Accordingly, the light directed to the first electrode 120 among the light generated from the organic electro luminescent layer 140 is not reflected.

According to an embodiment of the present invention, when the black matrix 124 and the first electrode 120 directly contact with each other, unintended chemical reaction may occur in their boundaries. In order to prevent this chemical reaction, a passivation layer 122 is formed between the first electrode 120 and the black matrix 124.

For example, the first electrode 120 is formed of a transparent conductive material such as ITO or IZO, and the passivation layer 122 is formed of an inorganic material such as nitride silicon ($SiN_x$) or silicon oxide ($SiO_2$). Also, the black matrix 124 can be formed of polymer and inorganic material or metal such as chrome (Cr).

The TFT T, the first electrode 120, the organic electro luminescent layer 140, and the second electrode 160 will be described in detail with reference to FIG. 4.

Referring to FIG. 4, in each sub-pixel, a semiconductor layer 62, a gate electrode 68, and source and drain electrodes 80 and 82 are sequentially formed on the transparent substrate 10, thereby forming a TFT region. The source electrode 80 is connected to a power electrode 72, which is formed on a power supply line. The drain electrode 82 is connected to an organic electro luminescent diode E including the first electrode 120, the organic electro luminescent layer 140 and the second electrode 160.

A capacitor electrode 64 is disposed at a lower portion corresponding to the power electrode 72, with an insulator interposed therebetween. These corresponding regions form a storage capacitor region.

Elements formed in the TFT region and the storage capacitor region constitutes an array element.

The organic electro luminescent diode E includes the first electrode 120 and the second electrode 160, which face each other, with the organic electro luminescent layer 140 interposed therebetween. The organic electro luminescent diode E is disposed at an emission region of the sub-pixel, where self-emitted light is emitted to the outside.

In this embodiment, as described above, the black matrix 124 and the passivation layer 122 are formed below the first electrode 120.

Figure 5:
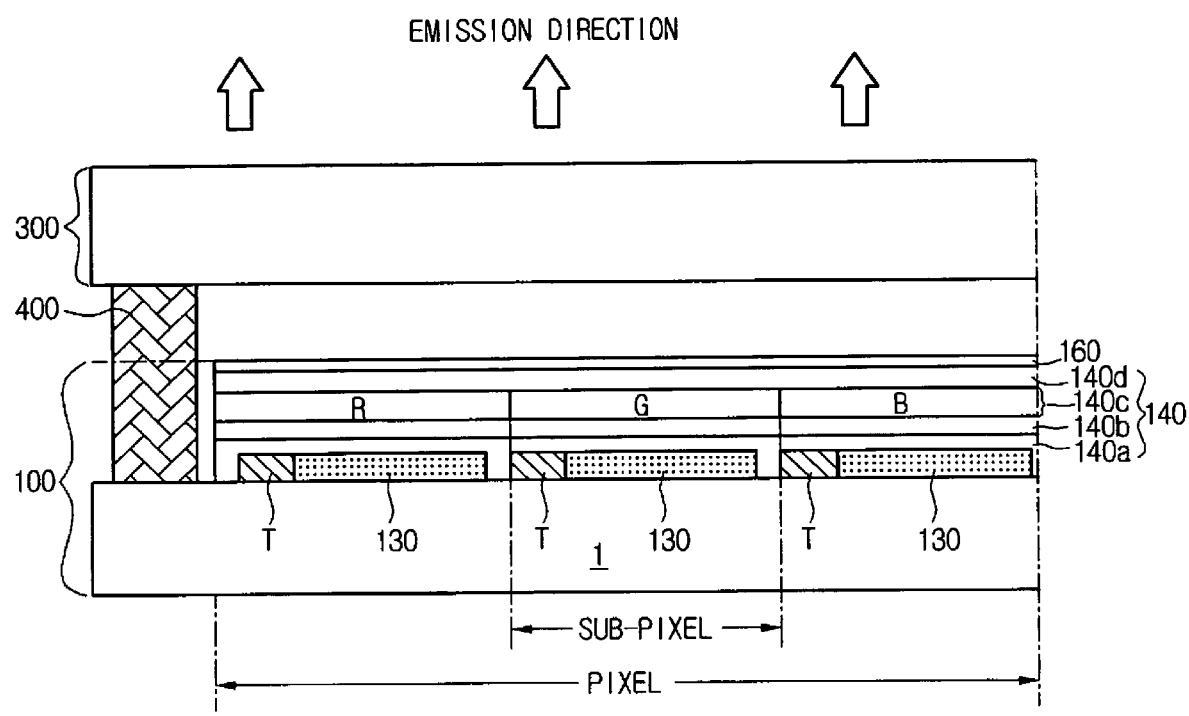
FIG. 5 is a schematic sectional view of a top emission type organic electro luminescence device according to another embodiment of the present invention.

FIG. 5 is a schematic sectional view of a top emission type organic electro luminescence device according to another embodiment of the present invention.

The same reference numerals are used to refer to the same parts in FIGS. 3 and 5. A detailed description about the same parts will be omitted for conciseness.

In the embodiment of FIG. 5, the first electrode is differently constructed. That is, the first electrode 130 used as the anode is formed not of the transparent conductive metal such as ITO or IZO, but is formed of a metal such as chrome (Cr) having a low reflectivity.

Generally, since a work function of ITO is about 4.8-5.1 eV and a work function of chrome is about 4.7 eV, chrome can be used for the first electrode. Since the reflectivity of chrome is low (about 68%), the color shift problem can be solved by using the chrome for the first electrode.

According to the present invention, the color shift problem is solved because the light reflected from the first electrode and passing through the second electrode is eliminated. Furthermore, since the reflection problem caused by the external light is also solved, the polarization film need not be attached on the second substrate, thereby reducing the manufacturing cost.

By forming the black matrix below the first electrode or forming the first electrode of metal with low reflectivity, the reflection of the light from the first electrode is minimized. Accordingly, the color shift problem caused by reflection can be eliminated. Also, since the polarization film is not used, the manufacturing cost can be reduced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro luminescence device comprising:
first and second substrates arranged to face each other;
a thin film transistor (TFT) formed on a TFT region of the first substrate in each sub-pixel including an emission region, the TFT region and a storage capacitor region;
a first electrode formed on the emission region of each pixel of the first substrate and connected to the TFT, wherein the first electrode is formed on an array element which is formed on the first substrate;
an organic electro luminescent layer on the emission region of each pixel;
a second electrode formed on at least two more pixels;
a black matrix disposed below the first electrode and directly on the array element of the emission region of each pixel; and
a passivation layer disposed between the first electrode and the black matrix and corresponding to the first electrode and the black matrix,
wherein a portion of the black matrix is disposed between a drain electrode of the TFT and a portion of the first electrode, and the entire portion of the black matrix is overlapped with the first electrode,
wherein the second electrode is formed of Al, Mg or Ca which is a metal having a low work function,
wherein the second electrode is formed of one of ITO and IZO,
wherein the second electrode is formed in a dual layer including Al of 10 Å and ITO of about 1000 Å, and
wherein the passivation layer includes an inorganic material for preventing unintended chemical reactions between boundaries of the first electrode and the black matrix, and the passivation layer is thinner than the first electrode or the black matrix.

2. The organic electro luminescence device according to claim 1, further comprising:
a seal pattern formed at edge portions of the first and second substrates.

3. The organic electro luminescence device according to claim 1, wherein the first electrode is an anode and the second electrode is a cathode.

4. The organic electro luminescence device according to claim 1, wherein the passivation layer contacts the first electrode and the black matrix.

5. The organic electro luminescence device according to claim 1, wherein the first electrode is formed of one of ITO and IZO.

6. The organic electro luminescence device according to claim 1, wherein the organic electro luminescent layer includes a hole injection layer, a hole transporting layer, an emission layer, and an electron transporting layer, which are sequentially formed on the first electrode.

7. The organic electro luminescence device according to claim 1, wherein the organic electro luminescence device is a top emission type organic electro luminescence device.

8. The organic electro luminescence device according to claim 1, further comprising:
 a power electrode connected to a source drain of the TFT on the storage capacitor region;
 a capacitor electrode disposed corresponding to the power electrode; and
 an insulator between the power electrode and the capacitor electrode to form a storage capacitor.

9. A fabrication method of an organic electro luminescence device, the fabrication method comprising:
 forming a thin film transistor (TFT) on a TFT region of a first substrate in each sub-pixel including an emission region, the TFT region and a storage capacitor region;
 forming a first electrode electrically connected to the TFT on the emission region of each pixel of the first substrate, wherein the first electrode is formed on an array element which is formed on the first substrate;
 forming an organic electro luminescent layer on the emission region of each pixel;
 forming a second electrode on at least two more pixels;
 forming a black matrix below the first electrode and directly on the array element of the emission region of each pixel; and
 forming a passivation layer between the first electrode and the black matrix and corresponding to the first electrode and the black matrix,
 coupling a second substrate to the first substrate,
 wherein a portion of the black matrix is disposed between a drain electrode of the TFT and a portion of the first electrode, and the entire portion of the black matrix is overlapped with the first electrode,
 wherein the second electrode is formed of Al, Mg or Ca which is a metal having a low work function,
 wherein the second electrode is formed of one of ITO and IZO,
 wherein the second electrode is formed in a dual layer including Al of 10 Å and ITO of about 1000 Å, and
 wherein the passivation layer includes an inorganic material for preventing unintended chemical reactions between boundaries of the first electrode and the black matrix, and the passivation layer is thinner than the first electrode or the black matrix.

10. The fabrication method according to claim 9, wherein the first electrode is an anode and the second electrode is a cathode.

11. The fabrication method according to claim 9, wherein the passivation layer contacts the first electrode and the black matrix.

12. The fabrication method according to claim 9, wherein the first electrode is formed of one of ITO and IZO.

13. The fabrication method according to claim 9, wherein the organic electro luminescence device is a top emission type organic electro luminescence device.

14. The fabrication method according to claim 9, further comprising:
 forming a power electrode connected to a source drain of the TFT on the storage capacitor region;
 forming a capacitor electrode corresponding to the power electrode; and
 forming an insulator between the power electrode and the capacitor electrode to form a storage capacitor.

* * * * *